United States Patent
Arthur et al.

(10) Patent No.: US 9,406,762 B2
(45) Date of Patent: Aug. 2, 2016

(54) SEMICONDUCTOR DEVICE WITH JUNCTION TERMINATION EXTENSION

(71) Applicant: GENERAL ELECTRIC COMPANY, Schenectady, NY (US)

(72) Inventors: Stephen Daley Arthur, Glenville, NY (US); Alexander Viktorovich Bolotnikov, Niskayuna, NY (US); Peter Almern Losee, Clifton Park, NY (US); Kevin Sean Matocha, El Dorado, AR (US); Richard Joseph Saia, Niskayuna, NY (US); Zachary Matthew Stum, Niskayuna, NY (US); Ljubisa Dragoljub Stevanovic, Niskayuna, NY (US); Kuna Venkat Satya Rama Kishore, Hyderabad (IN); James William Kretchmer, Ballston Spa, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/396,852

(22) PCT Filed: May 15, 2013

(86) PCT No.: PCT/US2013/041073
§ 371 (c)(1),
(2) Date: Oct. 24, 2014

(87) PCT Pub. No.: WO2013/173414
PCT Pub. Date: Nov. 21, 2013

(65) Prior Publication Data
US 2015/0115284 A1    Apr. 30, 2015

Related U.S. Application Data

(60) Provisional application No. 61/648,149, filed on May 17, 2012.

(51) Int. Cl.
*H01L 29/36* (2006.01)
*H01L 29/16* (2006.01)
(Continued)

(52) U.S. Cl.
CPC ............ *H01L 29/36* (2013.01); *H01L 29/0619* (2013.01); *H01L 29/0646* (2013.01);
(Continued)

(58) Field of Classification Search
CPC .. H01L 29/36; H01L 29/1608; H01L 29/0646
See application file for complete search history.

(56) References Cited

U.S. PATENT DOCUMENTS

| 4,305,084 A * | 12/1981 | Temple | ............... H01L 29/1004 257/134 |
| 5,864,167 A * | 1/1999 | Cutter | ................. H01L 29/0638 257/487 |

(Continued)

FOREIGN PATENT DOCUMENTS

| JP | 2002185015 A | * | 6/2002 |
| JP | 2011204710 A |   | 10/2011 |
| JP | 2014111476 A |   | 6/2014 |

OTHER PUBLICATIONS

Woongje Sung et. al.: "A New Edge Termination Technique for High-Voltage Devices in 4H-SiCa Multiple-Floating-Zone Junction Termination Extension", IEEE Electron Device Letters, IEEE Servicee Center, NY, NY, U.S. vol. 32, No. 7, Jul. 1, 2011.

(Continued)

*Primary Examiner* — Ida M Soward
(74) *Attorney, Agent, or Firm* — GE Global Patent Operation; William S. Munnerlyn

(57) ABSTRACT

A semiconductor device includes a substrate including silicon carbide; a drift layer disposed over the substrate including a drift region doped with a first dopant and conductivity type; and a second region, doped with a second dopant and conductivity type, adjacent to the drift region and proximal to a surface of the drift layer. The semiconductor device further includes a junction termination extension adjacent to the second region with a width and discrete regions separated in a first and second direction doped with varying concentrations of the second dopant type, and an effective doping profile of the second conductivity type of functional form that generally decreases away from the edge of the primary blocking junction. The width is less than or equal to a multiple of five times the width of the one-dimensional depletion width, and the charge tolerance of the semiconductor device is greater than $1.0 \times 10^{13}$ per $cm^2$.

12 Claims, 8 Drawing Sheets

(51) Int. Cl.
*H01L 29/06* (2006.01)
*H01L 29/739* (2006.01)
*H01L 29/861* (2006.01)
*H01L 21/04* (2006.01)
*H01L 29/66* (2006.01)
*H01L 29/78* (2006.01)

(52) U.S. Cl.
CPC ........ *H01L29/1608* (2013.01); *H01L 29/7395* (2013.01); *H01L 29/8611* (2013.01); *H01L 29/8613* (2013.01); *H01L 21/0465* (2013.01); *H01L 29/0638* (2013.01); *H01L 29/6606* (2013.01); *H01L 29/7811* (2013.01)

(56) References Cited

U.S. PATENT DOCUMENTS

| | | | | |
|---|---|---|---|---|
| 6,040,237 | A * | 3/2000 | Bakowski | H01L 21/0465 257/E21.058 |
| 6,566,726 | B1 * | 5/2003 | Onose | H01L 29/0615 257/488 |
| 7,030,426 | B2 * | 4/2006 | Neidig | H01L 29/0661 257/170 |
| 7,586,161 | B2 * | 9/2009 | Pfirsch | H01L 29/0615 257/378 |
| 8,330,244 | B2 * | 12/2012 | Zhang | H01L 21/046 257/471 |
| 8,680,587 | B2 * | 3/2014 | Henning | H01L 29/8611 257/155 |
| 8,749,017 | B2 | 6/2014 | Lu | |
| 8,803,192 | B2 * | 8/2014 | Vobecky | H01L 29/0615 257/171 |
| 8,997,788 | B2 | 4/2015 | Wozna | |
| 9,117,739 | B2 * | 8/2015 | Zhang | H01L 29/1608 257/472 |
| 2007/0246791 | A1 * | 10/2007 | Schulze | H01L 29/0615 257/495 |
| 2010/0132144 | A1 | 6/2010 | Rautray et al. | |
| 2010/0289032 | A1 * | 11/2010 | Zhang | H01L 21/0465 257/77 |
| 2011/0081772 | A1 * | 4/2011 | Ryu | H01L 29/0619 438/572 |
| 2011/0147766 | A1 * | 6/2011 | Tarui | H01L 21/046 257/77 |
| 2011/0220913 | A1 * | 9/2011 | Hatakeyama | H01L 29/0615 257/77 |
| 2011/0266558 | A1 * | 11/2011 | Yano | H01L 21/0485 257/77 |
| 2012/0122305 | A1 * | 5/2012 | Zhang | H01L 29/0615 438/526 |
| 2012/0309195 | A1 * | 12/2012 | Masuda | H01L 29/045 438/701 |
| 2012/0313212 | A1 * | 12/2012 | Sugawara | H01L 29/0615 257/471 |
| 2013/0214291 | A1 * | 8/2013 | Uchida | H01L 29/7828 257/77 |
| 2014/0077228 | A1 * | 3/2014 | Zhang | H01L 29/0615 257/77 |
| 2014/0327019 | A1 * | 11/2014 | Kinoshita | H01L 29/475 257/77 |

OTHER PUBLICATIONS

Megan Snook et. al.: "Sinale Photolithography/Implantation 120-Zone Junction Termination Extension for High-Voltage SiC Devices", Materials Science Forum, vol. 717720, May 4, 2012.

International Search Report and Written Opinion dated Aug. 26, 2013 which was issued in connection with PCT Patent Application No. PCT/US13/41073 which was filed on May 15, 2013.

Baliga, "Fundamentals of Power Semiconductor Devices", Springer, pp. 91-100, 2008.

unofficial translation of JP Office Action, dated Mar. 30, 2016, issued in connection with corresponding JP Application 2015-512777.

* cited by examiner

SEMICONDUCTOR DEVICE WITH JUNCTION TERMINATION EXTENSION

CROSS REFERENCE TO RELATED APPLICATIONS

This application claims priority to and the benefit of U.S. Provisional Patent Application Ser. No. 61/648,149, Steven Arthur et al., entitled "Semiconductor Device with Junction Termination Extension," which was filed on May 17, 2012, the disclosure of which is expressly incorporated by reference herein in its entirety.

BACKGROUND

The invention relates generally to semiconductor devices and, more particularly, to silicon carbide-based devices that utilize a junction termination extension.

Breakdown voltage of the reverse-blocking junction typically serves to limit the maximum reverse voltage that a semiconductor device formed with a p-n junction can withstand. Such a blocking junction may comprise, for example, a p-n junction of a thyristor, a diode, a bipolar transistor, an insulated-gate transistor, or a corresponding junction in a metal-oxide-semiconductor field-effect transistor (MOSFET). Avalanche breakdown occurs in such a device at a voltage substantially less than the ideal breakdown voltage because excessively high electric fields are present at certain locations ("high field points") in the device under reverse bias. A high field point of a blocking junction under reverse bias usually occurs slightly above the metallurgical junction along a region of curvature, such as that at the end of the junction.

In particular, breakdown voltage is critical for high power devices, such as silicon carbide (SiC) devices, and related properties, such as robustness to active dose and interface charge variation, are more significant in SiC devices, than in silicon (Si) based devices.

Semiconductor devices may utilize any of various structures and methods to achieve an increase in the breakdown voltage of a p-n junction, for example close to p-n junction entitlement. For example, junction termination extension (JTE) regions may be utilized near terminated portions of the p-n junction. In general, a JTE region may be considered as a more lightly doped extension of a heavily doped semiconductor region that adjoins a semiconductor region of the opposite conductivity type and which is usually lightly doped, to form the foregoing p-n junction. The principal function of the JTE region is to reduce the high concentration of electric fields that would otherwise exist in the vicinity of the non-terminated portion of the p-n junction, and especially at the high field points (which are typically near the corners of the locally doped regions), by laterally extending the blocking junction.

In addition to breakdown voltage, the design of the JTE affects a number of critical properties of the semiconductor device, including reliability, fabrication process complexity, and charge tolerance, and many of the affected properties have complex interrelationships.

It would therefor be desirable to provide a JTE design that improves the critical properties of silicon-carbide based semiconductor devices, such as break down voltage, charge tolerance and reliability.

DRAWINGS

These and other features, aspects, and advantages of the present invention will become better understood when the following detailed description is read with reference to the accompanying drawings in which like characters represent like parts throughout the drawings, wherein.

Figure 8:
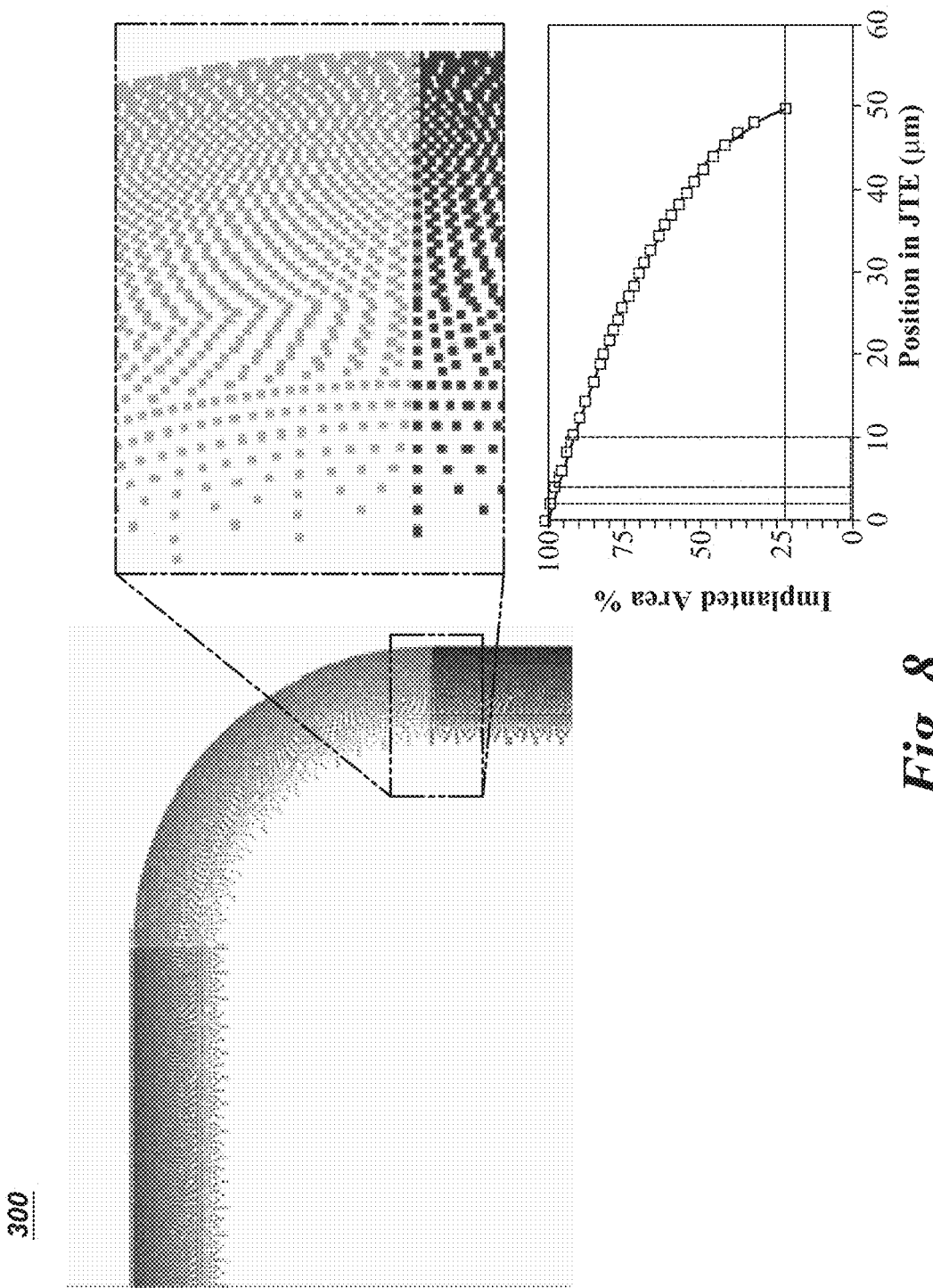
Figure 9:
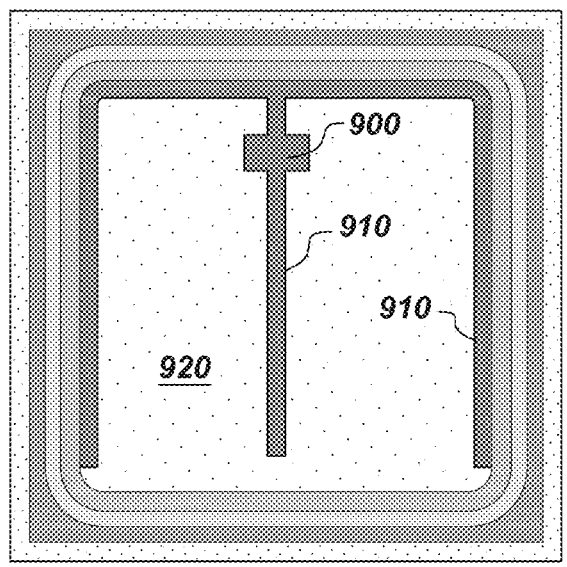
Figure 10:
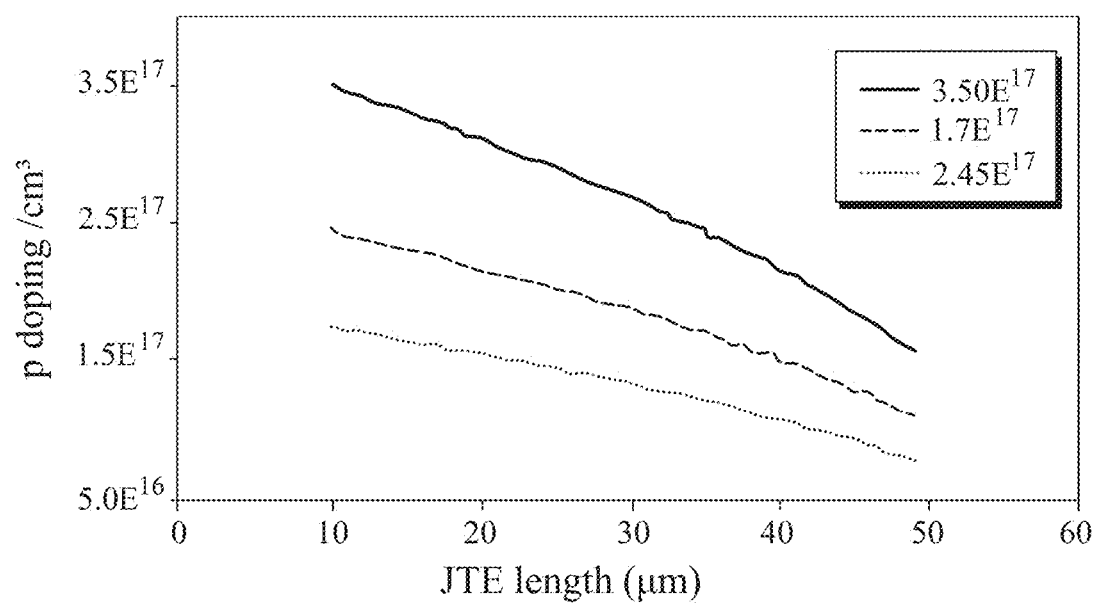
Figure 11:
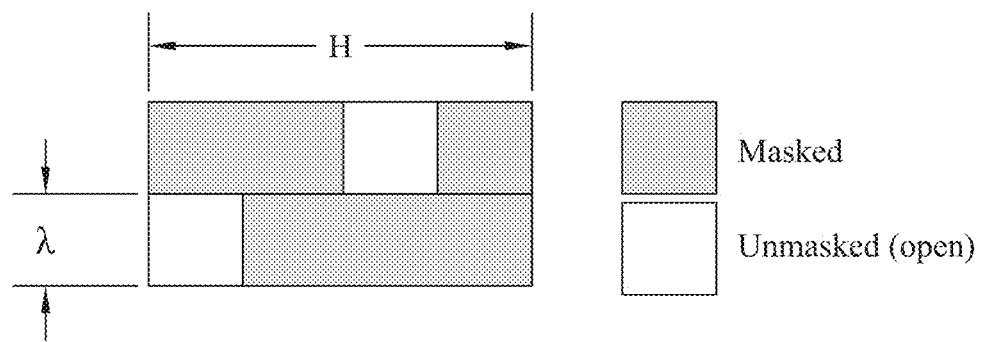
Figure 12:
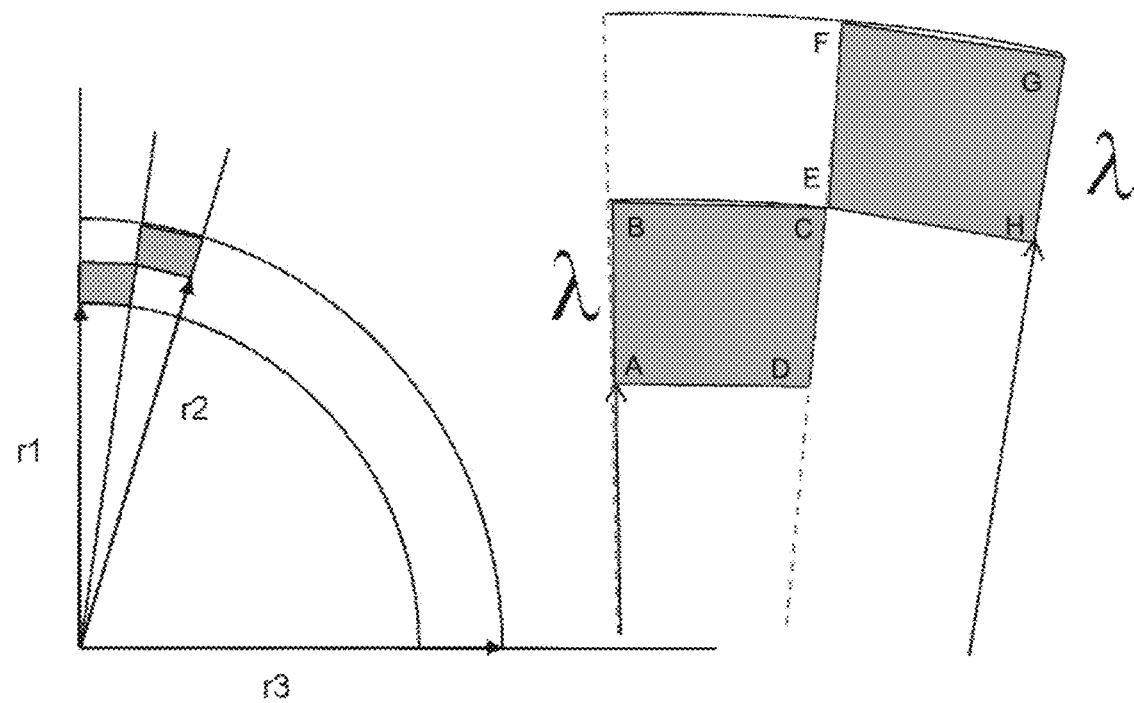

FIG. 8 schematically shows an example layout of a brick structure G-JTE mask with a varying lateral JTE dose;

FIG. 9 is a plan view of dimensional definitions for a generic vertical power device;

FIG. 10 illustrates example graded JTE (G-JTE) lateral doping profiles;

FIG. 11 illustrates an example unit cell for a brick structure G-JTE layout; and FIG. 12 illustrates the generation of unit cells around device corners where rectangular bricks become trapezoids, with heights determined by radial increases in steps of $\lambda$.

DETAILED DESCRIPTION

A technique for terminating high voltage SiC junctions is described below which can achieve blocking voltages extremely close to the one dimensional parallel-plane break down voltage (1-D $BV_{PP}$ limit) and offers improved robustness to active dose and interface charge variations which are more significant in SiC than Si power device applications. This new brick structure Graded Junction Termination (G-JTE) design, which for particular configurations, uses only one masking level, has been implemented with 1.2 kV SiC MOSFETs and representative test diodes. The blocking voltage (BV) of the test diodes reached the 1-D $BV_{PP}$ limit of approximately 1.6 kV with 11 µm, n-type 4H-SiC drift layers, doped ND=$9\times10^{15}$/cm$^3$, where ND is the donor concentration. The robustness to charge sensitivity has been experimentally verified, maintaining BV>1.2 kV over a wide range of implanted JTE doses ($2\times10^{13}$/cm$^2$ to over $4\times10^{13}$/cm$^2$), greatly outperforming the conventional single-zone JTE designs. This single masking step, brick structure G-JTE termination design lends itself especially well to even higher voltage device applications (>3 kV), where implementing multiple-zone JTEs, requiring multiple (up to four) masking levels, are routinely used. It should be noted that the JTE design was verified up to 8 kV.

Figure 1:
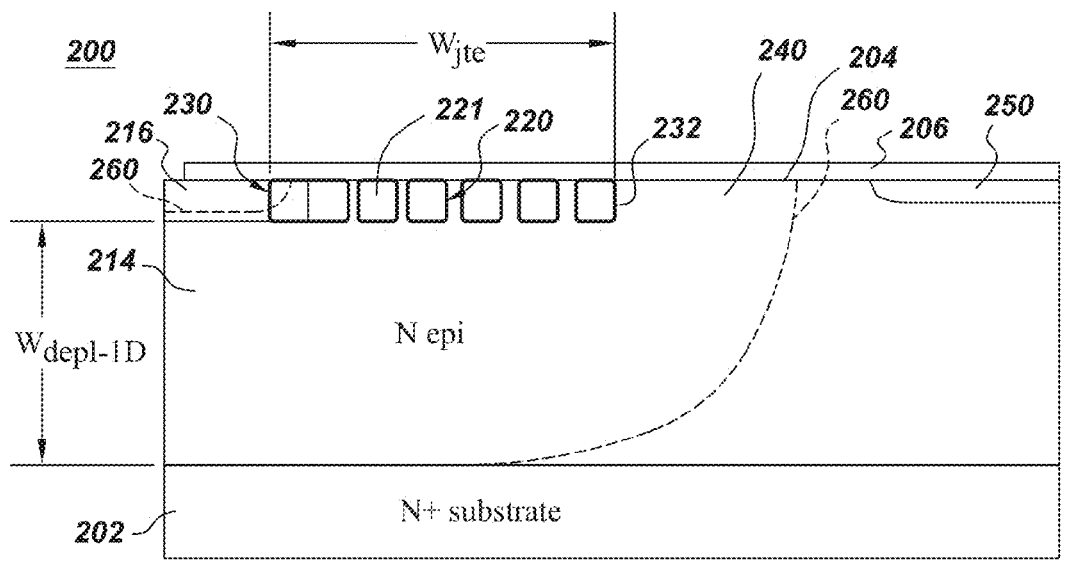
FIG. 1 is a cross-sectional view of an example diode configured in accordance with aspects of the present invention.

A semiconductor device 200 is described with reference to FIGS. 1-3 and FIGS. 5-10. It should be noted that although the contacts are not shown in FIG. 1 for ease of illustration, the semiconductor device will include contacts, as known in the art. As indicated in FIG. 1, the semiconductor device 200 includes a substrate 202 comprising silicon carbide. A drift layer 214 is disposed over the substrate 202 and comprises a drift region 214 doped with a first dopant type, so as to have a first conductivity type. The semiconductor device 200 further includes a second region 216 adjacent to the drift region 214 and proximal to a surface 204 of the drift layer 214. The second region 216 is doped with a second dopant type, so as to have a second conductivity type.

The semiconductor device 200 further includes a junction termination extension (JTE) 220 disposed adjacent to the second region 216. As indicated, for example, in FIGS. 1 and 2, the junction termination extension 220 has a width $w_{jte}$ and comprises a number of discrete regions 221 separated in a first direction 272 and in a second direction 274 (FIG. 2) and doped with varying concentrations of the second (p-type) dopant type, so as to have an effective doping profile of the second conductivity type of a functional form that generally decreases along a direction away from the edge of the primary blocking junction 230. It should be noted that by "varying concentration", it is meant that the density of the regions varies, and it is this varying density that defines the effective JTE dose that varies. Typically, all regions will have the same dose/doping. As used here, "effective doping" is the fraction of the JTE area that is open to receive the JTE implant dose versus the total area being sampled, and thus it is the equivalent of dosing the JTE at (fraction)*(full JTE dose) for that region. Some example effective doping levels include 15%, 50% and 90% of the full JTE dose. The width $w_{jte}$ (FIG. 1) is less than or equal to a multiple of five (5) times the width of the one-dimensional depletion width $W_{depl\_1D}$, and the charge tolerance of the semiconductor device 200 is greater than $1.0 \times 10^{13}$ per cm$^2$. For particular configurations, the interface (or field oxide) charge density may be about $1 \times 10^{12}$/cm$^2$, or even in a range of about 40-60% of $1 \times 10^{12}$/cm$^2$. Beneficially, the charge tolerance suffices to accommodate the interface charge density.

It should be noted that what is shown in FIG. 1 as $W_{depl\_1D}$ is the thickness of the epi layer $t_{epi}$ and generally, $W_{depl\_1D}$ is not equivalent to $t_{epi}$. As used here, charge tolerance is defined as the span of the JTE dose range for a particular JTE type where the breakdown voltage is greater than the design voltage. See, for example, Table 1.

TABLE 1

Charge Tolerance for three example JTE effective doping profiles (single zone, $x^{1/2}$, and $x^2$)

| Design | $W_{jte}/W_{depl\_1D}$ | JTE_dose_min (#/cm$^2$) | JTE_dose_max (#/cm$^2$) | Charge tolerance |
|---|---|---|---|---|
| Single zone | 4.4 | $1.1 \times 10^{13}$ | $1.6 \times 10^{13}$ | $0.5 \times 10^{13}$ |
| Quad design | 4.4 | $1.1 \times 10^{13}$ | $2.6 \times 10^{13}$ | $1.5 \times 10^{13}$ |
| SQRT design | 4.4 | $1.6 \times 10^{13}$ | $6.0 \times 10^{13}$ | $4.4 \times 10^{13}$ |

Figure 4:
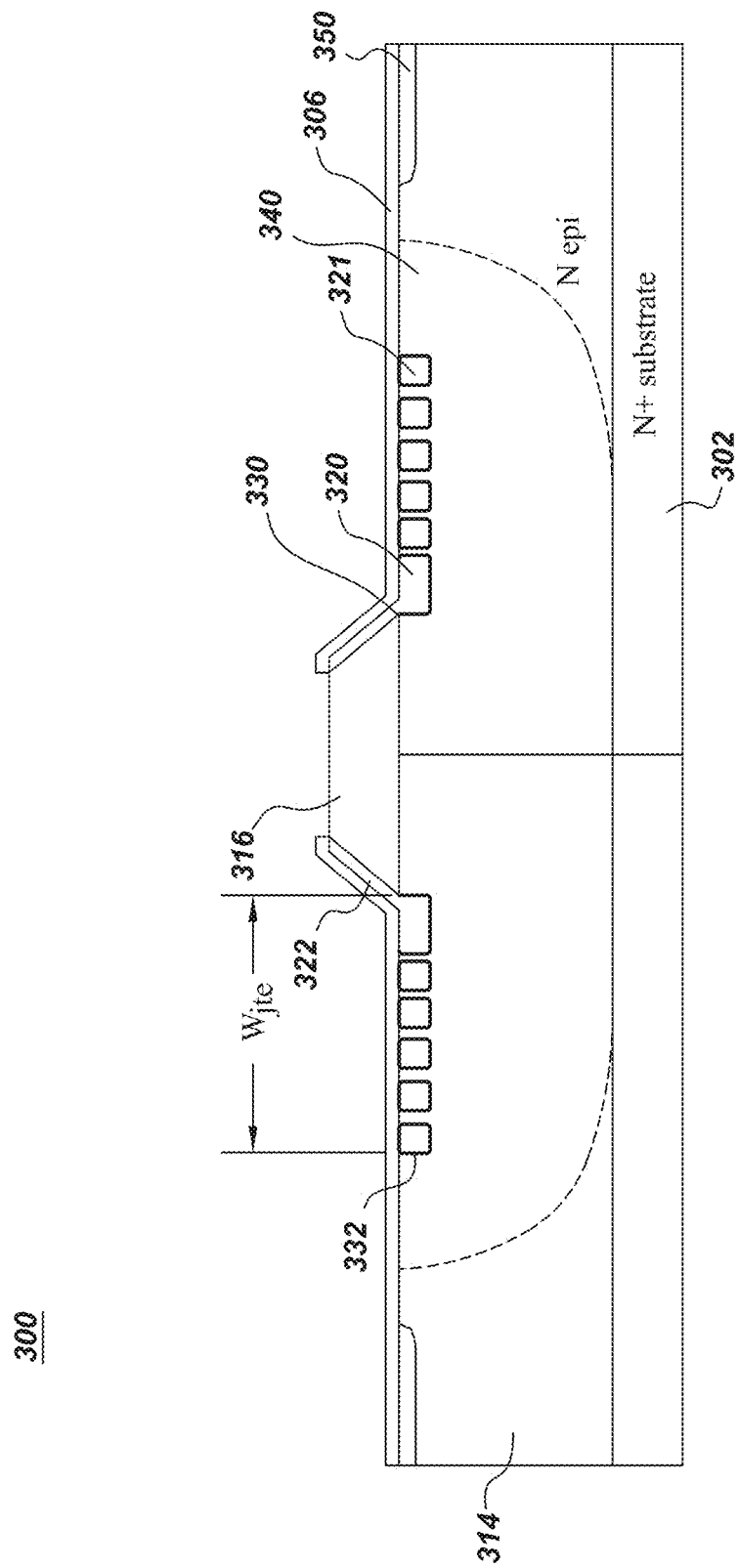
FIG. 4 is a cross-sectional view of an example mesa diode configured in accordance with aspects of the present invention.

As used here, "single zone" (indicated by reference numeral 520 in FIG. 5) refers to a constant dose. As discussed below, the effective doping profile (or effective impurity concentration) may be tailored depending on the specific device characteristics that are desired. For particular configurations, the effective doping profile of the junction termination extension 220 is a monotonically decreasing function N(x) of the distance x away from the edge of the primary blocking junction 230. Still more particularly, the monotonically decreasing function N(x) that governs the effective doping profile of the junction termination extension (220) varies as $x^{1/2}$, and still more particularly, is:

$$N(x)=N_{max}+(N_{min}-N_{max})(x/w_{jte})^{1/2},$$

where $N_{max}$ is the average dopant concentration at the edge of the primary blocking junction 230, and where $N_{min}$ is the average dopant concentration at an outer edge 232 (332 in FIG. 4) of the junction termination extension 220 (320 in FIG. 4).

Figure 5:
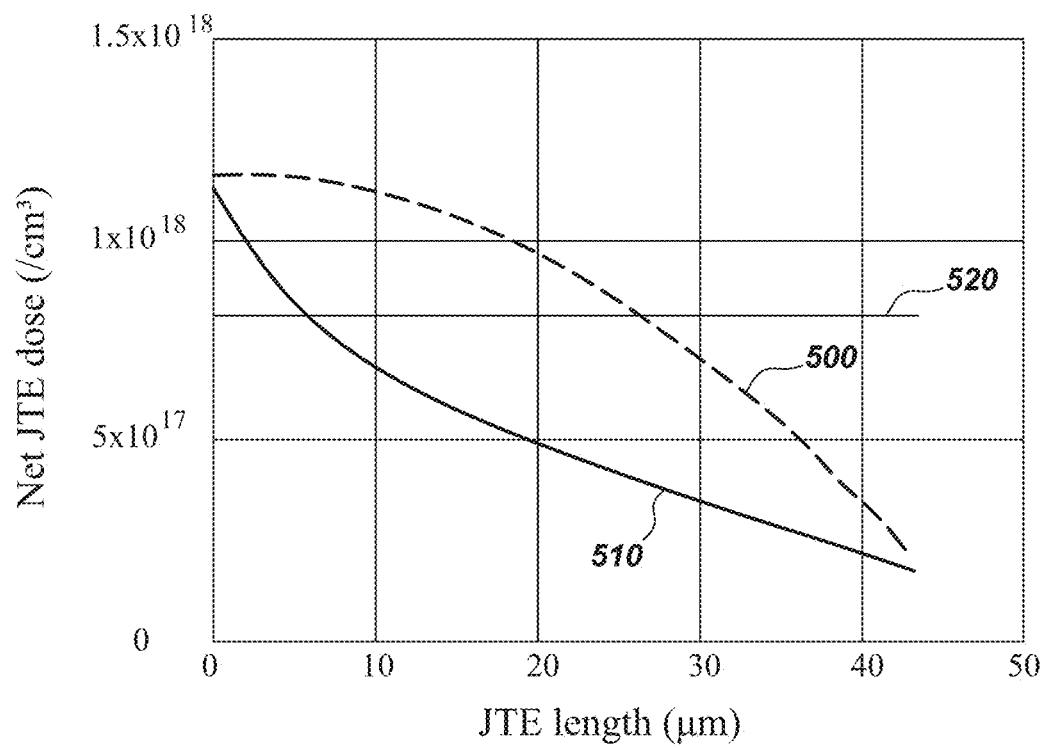
FIG. 5 illustrates three example JTE effective doping profiles (single zone, $x^{1/2}$, and $x^2$) across the length of the JTE.
Figure 6:
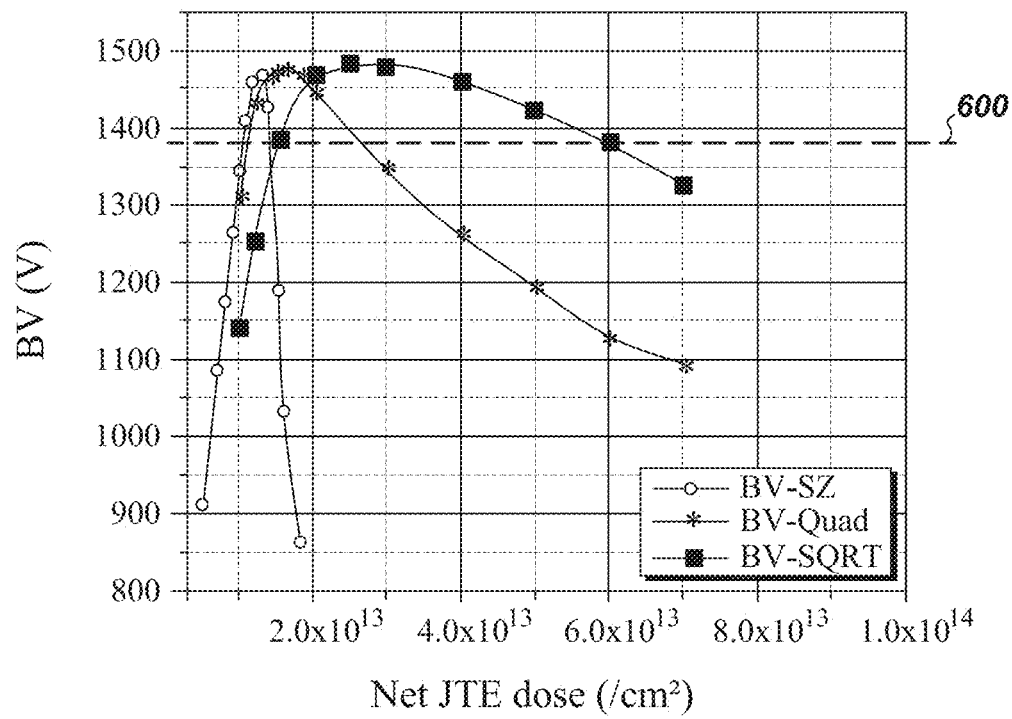
FIG. 6 shows the resulting breakdown voltage sensitivity to JTE peak dose variation curves for the three doping profiles used in FIG. 5.

FIG. 5 shows three example doping profiles across the length of an example JTE, and FIG. 6 shows the corresponding dose sensitivity curves. The JTE dose may be viewed as the net JTE dose. In addition to the square-root functional form (which is indicated by reference numeral 510 in FIG. 5) discussed above, FIG. 5 shows a monotonically decreasing function N(x) that governs the effective doping profile of the junction termination extension 220 which varies as $x^2$ (which is indicated by reference numeral 500 in FIG. 5) and, more particularly, which is $$N(x)=N_{max}+(N_{min}-N_{max})(x/w_{jte})^2,$$

where $N_{max}$ is the average dopant concentration at the edge of the primary blocking junction 230, and where $N_{min}$ is the average dopant concentration at an outer edge 232 of the junction termination extension 220.

As indicated in FIG. 6, although the single zone (reference numeral 520 in FIG. 5) and quadratic (reference numeral 500 in FIG. 5) effective doping profiles can achieve similar peak breakdown voltage (BV) values, the square-root (reference numeral 510 in FIG. 5) effective doping profile provides the broadest charge control range. For example, for a 1200 volt device and assuming that the design breakdown specification for the 1200 volt device is 15% greater than the device rating (≥1380 volts), the BV SQRT distribution provides the widest dose range which meets this constraint, ($\sim 1.8 \times 10^{13}$ to $6.0 \times 10^{13}$). The design voltage is indicated by reference numeral 600 in FIG. 6. If the JTE dose is centered at $3.5 \times 10^{13}$/cm$^2$, it can theoretically accommodate charge variations larger than $+/-1.7 \times 10^{13}$. By comparison the single zone JTE can achieve similar peak BV values, but the charge control range is much narrower, about $+/-2 \times 10^{12}$/cm$^2$ centered about the peak BV dose.

Returning now to FIG. 1, the semiconductor device 200 further includes a passivation layer 206 disposed over the drift layer 214. For particular configurations, the passivation layer 206 comprises a multilayer structure. A variety of materials for the passivation layer 206 may be used and include, without limitation, silicon oxide, phosphor doped silicate glass layer (PSG), silicon nitride, and polyimide. It should be noted that these are example materials for the passivation layer, and the passivation layer may take other forms depending on the specific implementation.

Charge tolerance is an important aspect of the semiconductor devices of present invention. To determine its significance, the present inventors posed the following rhetorical question: what are the sources and the magnitudes of charges available in the termination region for SiC? Listed in Table 2.2 below are estimates compared to the silicon case. Gate oxides are not directly relevant to termination considerations but are added as a lower bound for control of charge density for each technology. Charge densities in the table are treated as effective charge at the interface (as modeled in the charge sensitivity curves) and assumed positive in polarity however the charge sensitivity curve suggests that proper placement of the target JTE can accommodate either polarity.

TABLE 2.2

Estimates of the magnitudes of charge densities in silicon & SiC terminations:

| | silicon | SiC |
|---|---|---|
| gate oxide | $2 \times 10^{10}$/cm$^2$ | $2.5 \times 10^{11}$-$1.3 \times 10^{12}$/cm$^2$ |
| Field oxide | 1-3 $\times 10^{11}$/cm$^2$ | unknown |

TABLE 2.2-continued

Estimates of the magnitudes of charge densities in silicon & SiC terminations:

|  | silicon | SiC |
| --- | --- | --- |
| PECVD nitride effect | $1.0 \times 10^{12}/cm^2$ | $1.0 \times 10^{12}/cm^2$ |
| Dopant activation | ~100% | 40-70% |

The effects that are most important are those that contribute charge densities that are a significant fraction of that density required to support the peak E-field at breakdown, for silicon $Q_{0\_silicon} \sim 1.3 \times 10^{12}/cm^2$, for SiC $Q_{0\_SiC} \sim 1.3 \times 10^{13}/cm^2$. For SiC, the possible variation of the activated implant dose is the largest apparent contributor creating an uncertainty of $\sim 1 \times 10^{13}/cm^2$ when the target JTE dose is set at $3.5 \times 10^{13}/cm^2$. This is probably larger than the other effects; e.g. the field oxide charge density is unknown and speculated to be in the $10^{12}/cm^2$ range.

Having a termination that can accommodate a large range of charge variations without significant extra area being consumed is a major advantage as the process control of SiC charges (dynamic and static) is relatively immature compared to silicon. However, competing factors associated with the design of the junction termination extension can have various effects on the charge tolerance. Because of its overall importance to the performance and reliability of the semiconductor device, the JTE design is selected to ensure sufficient charge tolerance.

Figure 2:
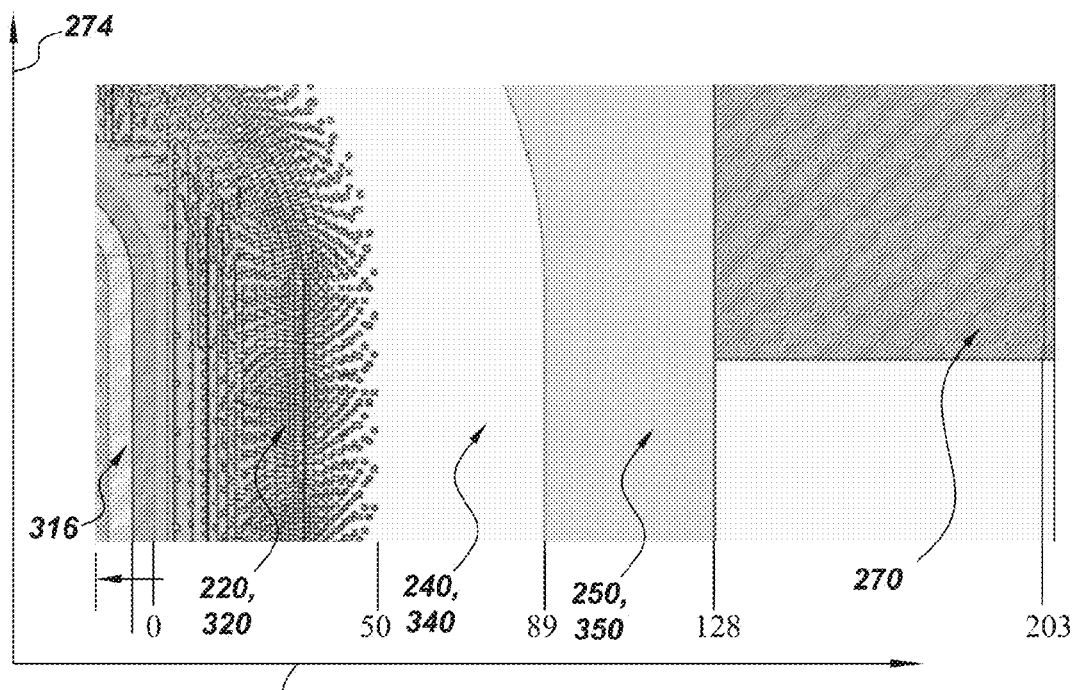
FIG. 2 is a partial top view, showing the varying dopant profile for an example junction termination extension (JTE)
Figure 7:
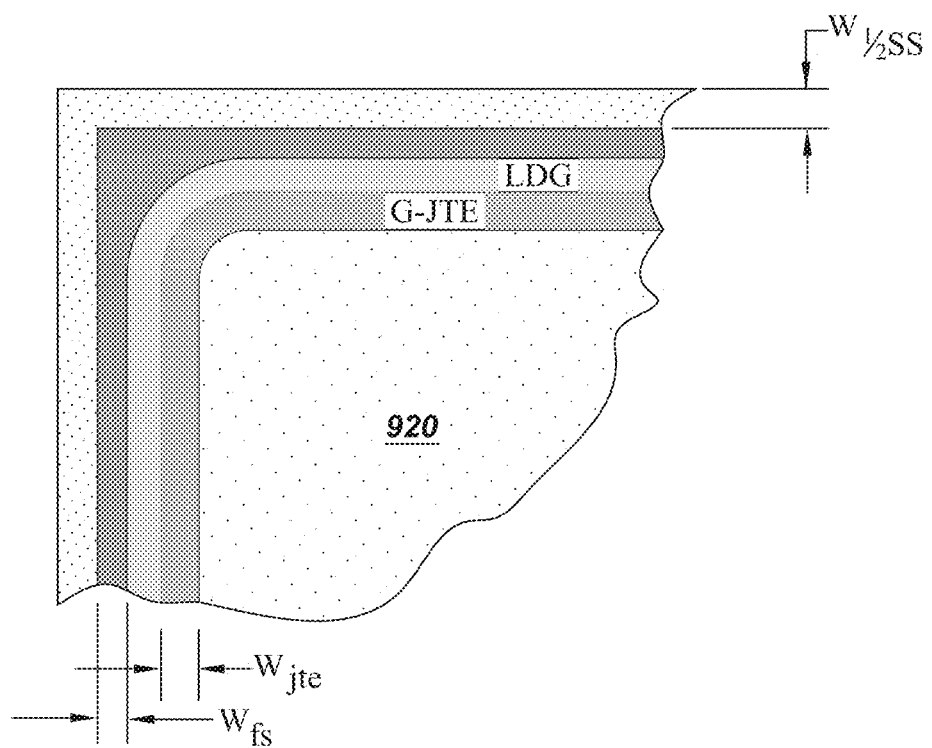
FIG. 7 is a plan view of dimensional definitions for a diode, which is generalizable to a generic vertical power device.
Figure 7:
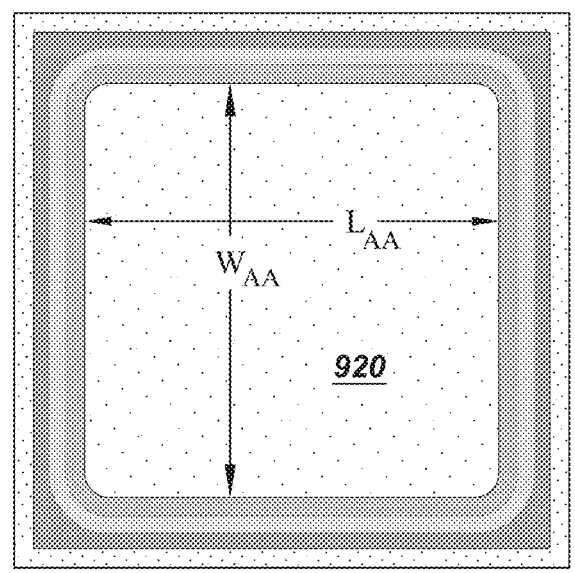

In addition to the functional form of the effective doping profile, the spacing and geometry can affect the charge tolerance and overall performance of the junction termination extension. FIG. 7 is a plan view of dimensional definitions for a diode with an active area 920, which can be generalized to a generic vertical power device. FIG. 2 shows an example "brick" structure for a junction termination extension. As used here, a "brick" 221 (FIG. 1) comprises a small, discrete region 221 of either an opening in an implantation mask (implanted dose) or a masked region (no dose). By varying the amount of open vs. masked areas using these "bricks", the continuous lateral doping profile simulated in the previous section could be approximated by a number of discrete regions. Referring to FIGS. 1 and 2, "G-JTE" 15 the graded JTE structure. "LDG" is the lateral depletion gap 240 (FIG. 1), 340 (FIGS. 3 and 4), which is the region where the epi reaches the surface plane. The depletion edge 260 is adjacent to the depletion gap 240. The fieldstop 250 (FIG. 1), 350 (FIG. 3), is a heavily doped region, doped with the same type as the epi (N type for the example shown in FIG. 1). The purpose of the fieldstop 250 is to stop any electric field from reaching the saw street, which separates the chips. The "saw street" is where the dicing saw cuts through the substrate to singulate devices from the wafer. A half saw street 270 is shown in FIG. 2. The semiconductor is damaged by the sawing, offering a leaky or resistive surface if any electric field is allowed to reach it. The fieldstop 250 halts any depletion expansion ensuring that the electric-field does not reach the saw street. Geometrically, the outside periphery can occupy a significant fraction of the chip area.

The minimum "brick" size (referred to herein as $\lambda$) is practically limited by lithographic and other microelectronic process steps, but in the limiting case wherein $\lambda \sim 0$ (defined below), the brick structure G-JTE becomes a continuous structure. FIG. 8 schematically shows an example layout of a brick structure G-JTE mask. The dose is varied from x=0 (100% implanted dose) by $x^{-1/2}$ with a discrete brick size of $\lambda \sim 1.3$ μm (illustrated)

For particular configurations, neighboring ones of the discrete doped regions 221 are separated from their nearest neighbors by a spacing in a range of about 0 to about $2.5\lambda$, assuming the minimum effective doping is no smaller than 15% of the full JTE dose. However, for other examples, the minimum effective doping may be less than 15% of the full JTE dose. For particular physical models, $\lambda$ may be defined as:

$$\lambda \leq (1/10) * W_{depl\_1D},$$

That is, $\lambda$ is defined as being less than or equal to one tenth of the width of the one dimensional depletion width of the blocking junction at its breakdown voltage. Higher voltage structures can use larger $\lambda$'s, as their 1D depletion widths are larger. For example: for BV~1000 volts, $W_{depl\_1D}$~10 μm in 4H SiC, therefore $\lambda$~1.0 um, for B~3000 volts, $W_{depl\_1D}$~30 μm and $\lambda \leq 3.0$ μm. As noted above, there is a limit to how well the small structures can be printed, and this will bound the lower dimension of $\lambda$.

The graded "brick" pattern can be formed using a graded, hard mask, for example a $SiO_2$ mask. With the graded JTE mask, the pattern goes from open islands to small holes. When designing the graded mask, a corrective factor may be used to achieve the desired functional form for the effective doping profile. That is, the algorithm used to generate the pattern of islands and holes in the $SiO_2$ mask may be corrected for proximity effects.

For particular configurations, the ratio of the active area of the junction termination extension 220 to the total area of the semiconductor device 200 is greater than about sixty percent (60%), and more particularly, is greater than about sixty five percent (65%), and still more particularly, is greater than about seventy percent (70%). Referring now to FIGS. 7 and 9, the active area 920 is that portion of the vertical power device that contributes directly to the vertical current flow. For example, for a PIN diode, the active area 920 would be the anode area (FIG. 7). Similarly, for switches, the active area is the area of the cells that control the current flow. For the power device shown in FIG. 9 (a field effect transistor, or FET, or an insulated gate bipolar transistor, or IGBT), the active area 920 now excludes the gate pad and the gate runners. More generally, areas of the vertical power device that are not part of the active area include: the areas reserved for the saw streets, the fieldstop regions, or any area taken up by the termination (LDG and JTE), and areas consumed by overhead items e.g. gate contact pads 900 or gate runners 910 (as shown in FIG. 9). The total device area is the area of the chip from corner to corner (usually power chips are squares or rectangles). For particular examples, JTEs may be formed using relatively small bricks (~1 μm), with 15%, 50% and 90% open areas. Beneficially, by achieving a relatively high active to total chip area ratio (while still achieving the necessary performance for the JTE), the current conduction when the device is in the "on" state is improved. This can be achieved, for example, by ensuring that the termination length (G-JTE+LDG+fieldstop) should be as short as possible, while still meeting all the design goals, as the termination occupies the outside periphery of the device.

It should be noted that the device structure indicated in FIG. 1 is applicable to a number of device types, depending on the specific doping. For example, for particular configurations, the silicon carbide substrate 202 has a n+ conductivity type, where the first dopant type is n-type, such that the first conductivity type is n-type, and where the second dopant type is p-type, such that the second conductivity type is p-type. For this configuration, the p-type second region 216 and the n-type drift layer 214 form a p-n junction, such that the semiconductor device 200 comprises a diode. This example diode configuration is illustrated schematically in FIG. 1. For other configurations, the substrate and the drift layer are p-type, and the second region is n-type.

Figure 3:
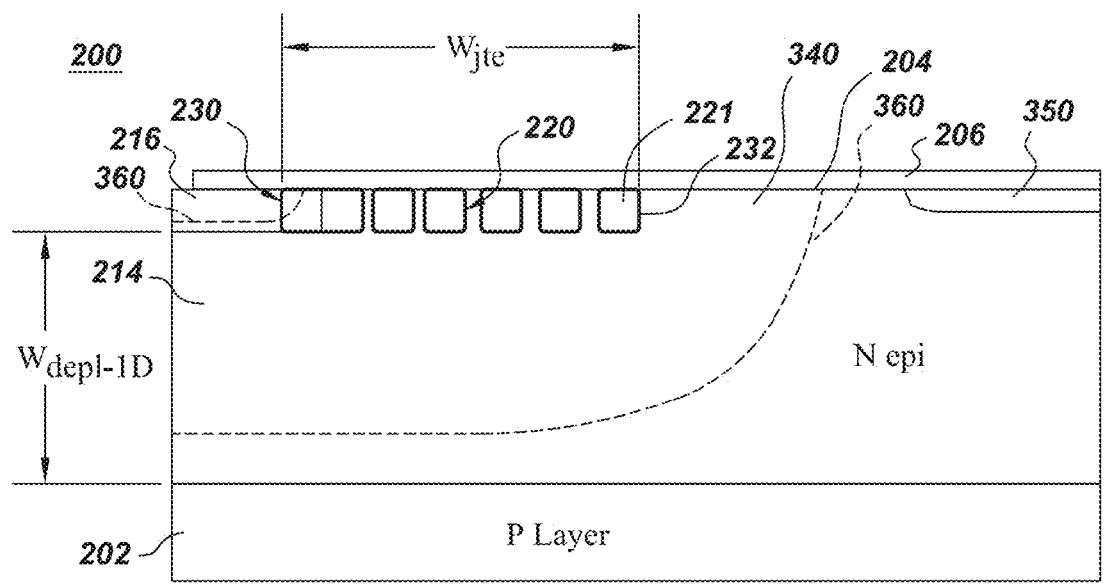
FIG. 3 is a cross-sectional view of the termination for a blocking junction for an IGBT configured in accordance with aspects of the present invention.

Similarly, for the configuration shown in FIG. 3, the silicon carbide substrate 202 has a p-type conductivity type, and the first dopant type is n-type, such that the first conductivity type is n-type. For this configuration, the second dopant type is p-type, such that the second conductivity type is p-type. For this configuration, the p-type second region 216 and the n-type drift layer 214 form a p-n junction, and the substrate 202 and the drift layer 214 form another p-n junction, such that the semiconductor device 200 comprises a transistor, for example a thyristor or an IGBT. This example transistor configuration is illustrated schematically in FIG. 3. It should be noted that although FIG. 3 shows a non-punch-through IGBT, the JTE is equally applicable to punch-through IGBTs as well, which include a buffer layer (not shown) of the same type as the drift layer.

Similarly, FIG. 3 also schematically illustrates a configuration, for which the silicon carbide substrate 202 has a n+-type conductivity type, and the first dopant type is p-type, such that the first conductivity type is p-type. For this configuration, the second dopant type is n-type, such that the second conductivity type is n-type. For this configuration, the n-type second region 216 and the p-type drift layer 214 form a p-n junction, and the substrate 202 and the drift layer 214 form another p-n junction, such that the semiconductor device 200 comprises a transistor, for example a thyristor or an IGBT. Other aspects of the device 200 shown in FIG. 3 are similar to those described above with reference to FIG. 1. For example, the junction termination extension 220 has a width $w_{jte}$ and comprises a number of discrete regions 221, which are doped with varying concentrations of the second (n-type) dopant type, so as to have an effective doping profile of the second conductivity type of a functional form that generally decreases along a direction away from the edge of the primary blocking junction 230. The outer edge 232 of the junction termination extension 220 is indicated in FIG. 3. The depletion edge 360 is adjacent to the depletion gap 340. The fieldstop 350 (FIG. 3), is a heavily doped region, doped with the same type as the epi (N type for the example shown in FIG. 3). As noted above, the purpose of the fieldstop 350 is to stop any electric field from reaching the saw street, which separates neighboring devices.

Further, the device 200 shown in FIG. 3 further includes a passivation layer 206 disposed over the drift layer 214. The passivation layer is described above with reference to FIG. 1.

Another semiconductor device 300 embodiment is described with reference to FIGS. 2 and 4-10. As shown in FIG. 4, the semiconductor device 300 includes a substrate 302 comprising silicon carbide. A drift layer 314 is disposed over the substrate 302 and is doped with a first (n-type) dopant type, so as to have a first conductivity type. An anode region 316 is disposed adjacent to the drift layer 314 and is doped with a second (p-type) dopant type, so as to have a second conductivity type. The semiconductor device 300 further includes a junction termination extension 320 disposed adjacent to the anode region 316 and extending around the anode region 316. As indicated in FIGS. 2 and 3, the junction termination extension 320 has a width $w_{jte}$ and comprises a number of discrete regions 321 separated in a first direction and in a second direction and doped with varying concentrations of the second (p-type) dopant type, so as to have an effective doping profile of the second conductivity type of a functional form that generally decreases along a direction away from the edge of the primary blocking junction 330. The width $w_{jte}$ (FIG. 3) is less than or equal to a multiple of five (5) times the width of the one-dimensional depletion width $W_{depl\_1D}$, and the charge tolerance of the semiconductor device 300 is greater than $1.0 \times 10^{13}$ per cm$^2$. This example mesa diode configuration is illustrated schematically in FIG. 4.

For particular configurations, the anode region 316 comprises a material that was epitaxially grown on the drift layer 314 and was subsequently partially etched to form the anode region 316. The JTE implant into the anode mesa sidewall is indicated by reference numeral 322 in FIG. 4 and physically connects the P+ anode to the P-type JTE pattern via the same type doping as the JTE that is located on the lower etched plane.

For particular configurations, the semiconductor device 300 further includes a passivation layer 306 disposed over the drift layer 314. The passivation layer is described above. In addition, the fieldstop region 350 and saw line are in the actual device. However, the saw line is not shown in FIG. 4 for ease of illustration.

The JTE 320 is similar to the JTE 220 described above. In particular, it should be noted that the JTE 220, 320 correspond to relatively high values of the following figure of merit (FOM):

$$JTEFOM = \left(\frac{Wdepl1D}{Wjte}\right) * \left(\frac{Qtol}{QEcritical}\right) * \left(\frac{BVpk}{BV1D}\right) * \left(\frac{Ereliable}{Epk\_oxide}\right)$$

As used here, $W_{JTE}$=width of the JTE from main junction edge toward the saw street, and $W_{1Ddepl}$=depletion width of the one dimensional vertical doping profile on the lightly doped side, so a narrower JTE gives a larger first term. For particular configurations, the first term should be in a range of about 0.2-1.0.

Turning now to the second term in this expression for the JTE FOM, Qtol=the charge tolerance range of the design in #/cm$^2$ (same as JTE dose), as calculated from the dose sensitivity curve, and QEcritical=Charges/cm$^2$ required to balance the critical electric field (from Gauss's law). Thus, the second term in the FOM is the ratio of the JTE charge tolerance divided by the charge required to create the critical 4H-SiC breakdown field derived from Gauss' law, e.g. see FIG. 3.5 in *Fundamentals of Power Semiconductor Devices*, B. Jayant Baliga, Springer-Science, 2008. The critical field is only a weak function of the doping on the lightly doped side of the junction and is ~$3.1 \times 10^6$ volts/cm for $9 \times 10^{15}$/cm3 doped material common to 1200 volt devices. This gives QE$_{critical}$=∈*E$_{critical}$=(9.7)*($8.85 \times 10^{-14}$ F/cm)*($3.1 \times 10^6$ V/cm)/($1.6 \times 10^{-19}$ coul/charge), ≅$1.7 \times 10^{13}$ charges/cm$^2$. Although this value was estimated for a 1200 V design, one skilled in the art will recognize that QE$_{critical}$ is a function of the device rating. The charge tolerance is taken as the dose width of the BV vs JTE dose curve above the design voltage, typically >15% above rated BV [design voltage ≥(BV rating) *1.15]. $Q_{tol}$ is given in units of # of unit charges/cm$^2$ (e.g. units of implant dose). For particular configurations, $Q_{tol}$>$1.0 \times 10^{13}$, and may be greater. For example, the data presented in Table 1 shows $Q_{tol}$ of $1.5 \times 10^{13}$ for Quad design and $4.4 \times 10^{13}$ for the SQRT design, so the $Q_{tol}$/QE$_{critical}$ ratio may be 0.6 for $Q_{tol}$=$1.0 \times 10^{13}$, 0.88 for the Quad design, and 2.6 for the SQRT designs for the 1200 volt device data shown.

The third term of the JTE FOM is the ratio of the peak breakdown voltage (BV) achievable ($BV_{pk}$, due to the termination design) vs. the 1D BV entitlement, given by calculating the avalanche BV for the 1D doping profile of the main blocking junction. This ratio should be in the range 0.80 to 1.0 (>80% of 1D entitlement), and for particular configurations >90% (ratio >0.9).

The fourth term in the JTE FOM is the ratio of maximum peak electric field strength in the passivation layer directly covering the termination at the rated voltage (e.g. 1200 volts) considered acceptable for long term reliability, $E_{reliable}$, to the calculated peak field in the oxide layer, $E_{pk\_oxide}$, for a given design and surface charge. The design goal is to keep $E_{pk\_oxide} < E_{reliable}$ so the passivation has long term reliability. This ratio should never be less than 1.0, and may be larger (ratios of 1.0-2.0 are typical). As an example, for silicon oxide $E_{reliable} \sim 4 \times 10^6$ V/cm is commonly quoted as the value below which silicon dioxide has extended long term reliability.

It should be noted that the device structure indicated in FIG. 4 is applicable to a number of device types, depending on the specific doping. For example, for particular configurations, the silicon carbide substrate 302 has a n+ conductivity type, and the first dopant type is n-type, such that the first conductivity type is n-type. For this configuration, the second dopant type is p-type, such that the second conductivity type is p-type. For this configuration, the p-type anode region 316 and the n-type drift layer 314 form a p-n junction, such that the semiconductor device 300 comprises a mesa diode. This example mesa diode configuration is illustrated schematically in FIG. 4.

Similarly, for other configurations the silicon carbide substrate 302 has a p-type conductivity type, and the first dopant type is n-type, such that the first conductivity type is n-type. For these configurations, the second dopant type is p-type, such that the second conductivity type is p-type. For this configuration, the p-type anode region 316 and the n-type drift layer 314 form a p-n junction, and the substrate 302 and the drift layer 314 form another p-n junction, such that the semiconductor device 300 comprises a transistor, for example a thyristor or an IGBT.

Further, for other configuration, the silicon carbide substrate 302 has a n+-type conductivity type, and the first dopant type is p-type, such that the first conductivity type is p-type. For these configurations, the second dopant type is n-type, such that the second conductivity type is n-type. For this configuration, the n-type anode region 316 and the p-type drift layer 314 form a p-n junction, and the substrate 302 and the drift layer 314 form another p-n junction, such that the semiconductor device 200 comprises a transistor, for example a thyristor or an IGBT.

A semiconductor device is also described with reference to FIGS. 1, 2, 11 and 12. As indicated in FIG. 1, the semiconductor device includes a semiconductor substrate (for example, a SiC substrate) having a first surface and a second surface; an active region formed on the substrate; and an edge region surrounding the active region and having a width $W_{edge}$.

As indicated in FIGS. 2 and 12, the edge region includes a number of discrete corner regions having impurities of a second conductivity type. As indicated in FIGS. 2 and 11, the edge region further includes a number of discrete straight regions having impurities of the second conductivity type. As indicated in FIG. 2, at least one of the straight regions adjoins respective ones of the corner regions. The effective impurity concentration (or effective doping profile, as described above) of the second conductivity type decreases along a direction away from an interface between the edge region and the active region. As indicated in FIGS. 11 and 12, the shape of the corner regions differs from the shape of the straight regions. The width of the edge region $W_{edge}$ is less than or equal to a multiple of five (5) times the one dimensional depletion width ($W_{depl\_1D}$).

For particular configurations, at least one of the straight regions has a rectangular shape, and at least one of the corner regions has a trapezoidal shape. FIG. 11 shows example square (rectangular) straight regions, whereas FIG. 12 shows example trapezoidal corner regions. For more particular configurations, each of the straight regions is rectangular, and each of the corner regions is trapezoidal. For the specific arrangement shown in FIG. 11, the straight regions are square. As will be recognized by those skilled in the art, the "square", "rectangular", and "trapezoidal regions will not typically be perfectly square, rectangular or trapezoidal but rather will typically have somewhat rounded corners as a result of the inherent limitations of the processing techniques involved. In addition, these shapes (rectangular, square, and trapezoidal) are only possible example shapes for the doped JTE regions, and the regions may have other shapes, as well, for example circular.

A semiconductor device is described with reference to FIGS. 1-3 and 5-8. As indicated in FIGS. 1 and 3, for example, the semiconductor device includes a semiconductor substrate (for example, a SiC substrate) having a first surface and a second surface; an active device region formed on the substrate comprising a primary blocking junction; and an edge region adjacent the primary blocking junction having a width $W_{edge}$.

As indicated in FIGS. 1 and 2, for example, the edge region comprises a number of discrete regions having a number of impurities of a first conductivity type, where an effective impurity concentration of the first conductivity type in the edge region decreases along a direction away from an interface between the primary blocking junction and the edge region. The width of the edge region $W_{edge}$ is less than or equal to a multiple of five (5) times the one dimensional depletion width ($W_{depl\_1D}$). More particularly, the edge region has a charge tolerance of at least about $1.0 \times 10^{13}/cm^2$.

Beneficially, the above-described junction termination extensions are area efficient, using a minimum chip area to achieve a large $BV/BV_{pp}$ ratio, thus maximizing the allowable chip active area, for example resulting in area efficiencies for the semiconductor device that exceed seventy percent (70%). In addition, the above-described junction termination extensions have designs that are scalable for higher and lower voltages. Another significant benefit of the above-described junction termination extensions is their charge tolerance, that is the resulting semiconductor devices can accommodate relatively large swings in surface charge, for example in the passivation layer above the junction termination extension or corresponding to doping activation variability for silicon carbide (SiC). This improved charge tolerance is particularly important for SiC devices, where the interface charge is unknown and may be dynamic.

Yet another benefit of the above-described junction termination extensions is their reliability, namely, the electric field in the dielectric above the termination is within acceptable limits. For example, modeling results for the present designs show peak static fields <1 MV/cm. Other benefits include providing a passivation scheme over the termination with improved mechanical immunity from scratches, moisture, and ionic transport. Further, the above-described junction termination extensions are practical to implement, in that they require relatively simple processing and are compatible with FET process and materials. In addition, the above-described junction termination extensions possess good capability under high dV/dt.

Although only certain features of the invention have been illustrated and described herein, many modifications and changes will occur to those skilled in the art. For example, although the invention is described with reference to specific device structures, it is equally applicable to other vertical device structures, including without limitation, Schottky devices, junction barrier JBS Schottky devices, MPS and bipolar junction transistors. Similarly, although many of the above-described examples include a junction termination extension, a depletion region and a field stop, the above described JTE designs are equally applicable to semiconductor devices that do not include field stops. It is, therefore, to be understood that the appended claims are intended to cover all such modifications and changes as fall within the true spirit of the invention.

What is claimed is:

1. A semiconductor device, comprising:
    a substrate comprising silicon carbide;
    a drift layer disposed over the substrate and comprising a drift region doped with a first (n-type) dopant type, so as to have a first conductivity type;
    a second region adjacent to the drift region and proximal to a surface of the drift layer, wherein the second region is doped with a second (p-type) dopant type, so as to have a second conductivity type; and
    a junction termination extension disposed adjacent to the second region, wherein the junction termination extension has a width wjte and comprises a plurality of discrete regions separated from their nearest neighbors in a first direction and in a second direction and doped with varying concentrations of the second (p-type) dopant type, so as to have an effective doping profile of the second conductivity type of a functional form that generally decreases along a direction away from an edge of a primary blocking junction,
    wherein a width wjte is less than or equal to a multiple of five (5) times a width of the one-dimensional depletion width (Wdepl_1D), and
    wherein a charge tolerance of the semiconductor device is greater than $1.0 \times 10^{13}$ per cm2.

2. The semiconductor device of claim 1, wherein the effective doping profile of the junction termination extension is a monotonically decreasing function N(x) of the distance x away from the edge of the primary blocking junction.

3. The semiconductor device of claim 2, wherein the monotonically decreasing function N(x) that governs the effective doping profile of the junction termination extension varies as $x^{1/2}$.

4. The semiconductor device of claim 2,
    wherein the monotonically decreasing function that governs the effective doping profile of the junction termination extension is:

$N(x) = N\max(N\min - N\max)(x/wjte)^{1/2}$, wherein Nmax is the average dopant concentration at the edge of the primary blocking junction, and
    wherein Nmin is the average dopant concentration at an outer edge of the junction termination extension.

5. The semiconductor device of claim 1,
    wherein the monotonically decreasing function that governs the effective doping profile of the junction termination extension is:

$N(x) = N\max + (N\min - N\max)(x/wjte)2$, wherein Nmax is the average dopant concentration at the edge of the primary blocking junction, and
    wherein Nmin is the average dopant concentration at an outer edge of the junction termination extension.

6. The semiconductor device of claim 1, wherein neighboring ones of the discrete doped regions are separated from their nearest neighbors by a spacing in a range of about 0 to about 2.5.

7. The semiconductor device of claim 6, wherein the minimum effective doping is no smaller than 15% of the full JTE dose.

8. The semiconductor device of claim 1,
    wherein the silicon carbide substrate has a n+ conductivity type,
    wherein the first dopant type is n-type, such that the first conductivity type is n-type, and
    wherein the second dopant type is p-type, such that the second conductivity type is p-type.

9. The semiconductor device of claim 1,
    wherein the silicon carbide substrate has a p-type conductivity type,
    wherein the first dopant type is n-type, such that the first conductivity type is n-type, and
    wherein the second dopant type is p-type, such that the second conductivity type is p-type.

10. The semiconductor device of claim 1,
    wherein the silicon carbide substrate has a n+-type conductivity type,
    wherein the first dopant type is p-type, such that the first conductivity type is p-type, and
    wherein the second dopant type is n-type, such that the second conductivity type is n-type.

11. The semiconductor device of claim 1,
    wherein the width wjte is in a range of 0.2-1.0 times the width of the one-dimensional depletion width (Wdepl_1D), and
    wherein a charge tolerance of the semiconductor device is in a range of 0.9-2.6 times QEcritical.

12. The semiconductor device of claim 11, wherein a peak breakdown voltage (BVpk) is in a range of 0.8-1.0 times a one-dimensional breakdown voltage entitlement BV1D.

* * * * *